United States Patent
Draving et al.

(10) Patent No.: US 10,142,066 B1
(45) Date of Patent: Nov. 27, 2018

(54) JITTER ANALYSIS SYSTEMS AND METHODS

(71) Applicant: Keysight Technologies, Inc., Minneapolis, MN (US)

(72) Inventors: Steven D. Draving, Colorado Springs, CO (US); Christopher P. Duff, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 15/670,789

(22) Filed: Aug. 7, 2017

(51) Int. Cl.
*H04L 1/20* (2006.01)
*G01R 29/027* (2006.01)
*H04L 25/03* (2006.01)
*G01R 29/26* (2006.01)

(52) U.S. Cl.
CPC .......... *H04L 1/205* (2013.01); *G01R 29/0273* (2013.01); *H04L 25/03146* (2013.01); *G01R 29/26* (2013.01)

(58) Field of Classification Search
CPC ... H04L 1/205; H04L 25/031; G01R 29/0273; G01R 29/26
See application file for complete search history.

(56) References Cited

U.S. PATENT DOCUMENTS

| | | | | |
|---|---|---|---|---|
| 2007/0195874 A1* | 8/2007 | Aziz | ..................... | H04L 7/0062 375/233 |
| 2009/0097538 A1* | 4/2009 | Aziz | ................. | H04L 25/03019 375/232 |
| 2009/0161747 A1* | 6/2009 | Aziz | ..................... | H03K 5/135 375/231 |
| 2010/0329326 A1* | 12/2010 | Aziz | ................. | H04L 25/03057 375/233 |

* cited by examiner

*Primary Examiner* — Jaison Joseph

(57) ABSTRACT

Various illustrative embodiments pertain to a signal quality evaluation system having a decision feedback equalizer (DFE) and a signal quality evaluator. The DFE receives an input signal containing symbols that represent digital data and uses the symbols to generate multiple detection thresholds. Each detection threshold is one of several detection thresholds that can be generated by the DFE by processing one or more symbols present in the input signal prior to a current clock cycle of a clock that is recovered from the input signal. The signal quality evaluator uses the detection thresholds provided by the DFE to detect transitions in the input signal. The signal quality evaluator may execute jitter measurements and/or time interval error (TIE) measurements by evaluating the transitions in the input signal.

20 Claims, 7 Drawing Sheets

JITTER ANALYSIS SYSTEMS AND METHODS

BACKGROUND

The quality of a digital signal can be evaluated in various ways such as by measuring the number of bit errors generated by the digital signal when the digital signal is received in a receiver. One of several causes for bit errors is due to timing variations in various edges of the digital signal. These timing variations can be observed in an oscilloscope as back-and-forth movement of various edges of the digital signal. The back-and-forth movement, which is commonly referred to as jitter, can be measured on the oscilloscope and/or by using other jitter measurement instruments.

Traditional jitter measurements typically involve the use of a measurement instrument to detect transitions in the digital signal crossing a certain detection threshold (the transitions indicate edges in the digital signal and these edges are examined for measuring jitter). For a differential signal, the detection threshold is typically zero volts.

Unfortunately, the use of a single detection threshold can lead to some shortcomings. For example, some traditional jitter measurements involve adapting the digital signal in order to make the digital signal suitable for applying a single detection threshold. Adapting the digital signal in this manner may involve changing a waveshape of the digital signal and/or introducing an offset voltage in the digital signal. Either of these actions may lead to misleading and/or erroneous jitter measurements being made.

It is therefore desirable to provide a solution in which rather than adapting the digital signal to the detection threshold (as done traditionally), the detection threshold is adapted to the digital signal instead.

SUMMARY

According to one exemplary embodiment of the present invention, a method includes generating a first detection threshold by a decision feedback equalizer, the generating comprising the decision feedback equalizer operating upon at least a first symbol present in an input signal; detecting at least a first transition in the input signal by utilizing the first detection threshold; and evaluating one or more timing characteristics of the input signal by evaluating at least the first transition in the input signal.

According to another exemplary embodiment of the present invention, a method includes generating a first detection threshold by a decision feedback equalizer, the generating comprising the decision feedback equalizer operating upon at least a first symbol present in an input signal; detecting at least a first transition in the input signal by utilizing the first detection threshold; generating a second detection threshold by the decision feedback equalizer, the generating comprising decision feedback equalizer operating upon at least a second symbol present in the input signal; detecting at least a second transition in the input signal by utilizing the second detection threshold; and evaluating one or more timing characteristics of the input signal by evaluating at least one of the first transition in the input signal or the second transition in the input signal.

According to yet another exemplary embodiment of the present invention, a system includes a decision feedback equalizer and a signal quality evaluator. The decision feedback equalizer is configured to generate a first detection threshold by operating upon at least a first symbol present in an input signal. The signal quality evaluator is configured to receive the first detection threshold from the decision feedback equalizer; detect at least a first transition in the input signal by utilizing the first detection threshold; and evaluate one or more timing characteristics of the input signal by evaluating at the first transition in the input signal.

Other embodiments and aspects of the present invention will become apparent from the following description taken in conjunction with the following drawings.

BRIEF DESCRIPTION OF THE FIGURES

Many aspects of the invention can be better understood by referring to the following description in conjunction with the accompanying claims and figures. Like numerals indicate like structural elements and features in the various figures. For clarity, not every element may be labeled with numerals in every figure. The drawings are not necessarily drawn to scale; emphasis instead being placed upon illustrating the principles of the invention. The drawings should not be interpreted as limiting the scope of the invention to the example embodiments shown herein.

DETAILED DESCRIPTION

Figure 1:
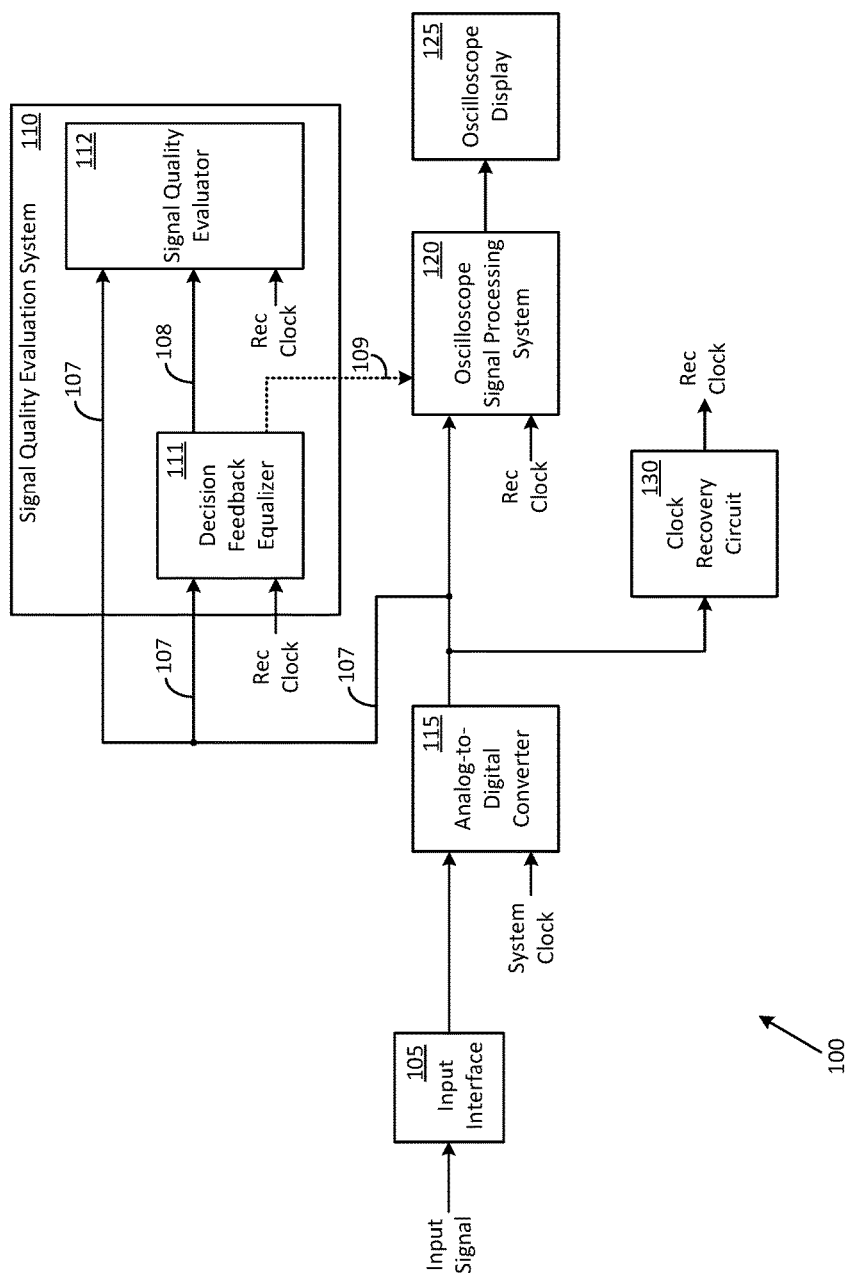
FIG. 1 shows a system that includes some exemplary functional blocks for evaluating timing characteristics of a signal in accordance with an embodiment of the present invention.

Throughout this description, embodiments and variations are described for the purpose of illustrating uses and implementations of inventive concepts. The illustrative description should be understood as presenting examples of inventive concepts, rather than as limiting the scope of the concepts as disclosed herein. Towards this end, certain words and terms are used herein solely for convenience and such words and terms should be broadly understood as encompassing various objects and actions that are generally understood in various forms and equivalencies by persons of ordinary skill in the art. For example, the words "connected" and "line" as used herein generally indicates a physical connection between two objects, the word "couple" as used herein generally refers to a transfer of a signal from one element to another, and the word "propagate" as used herein generally refers to the passage of a signal through an element (such as a detector diode or a resistor). As another example, the phrase "configured to" as used herein generally indicates refers to an object having a physical structure and/or capability to execute an action that is described in the context of the phrase. The action can include "processing" a signal where the word "processing" includes propagating the signal through various logic circuitry (and/or utilizing software code) to manipulate digital data that constitutes the signal. It should also be understood that the word "example" as used herein is intended to be non-exclusionary and non-limiting in nature. More particularly, the word "exemplary" as used herein indicates one among several examples and it should be understood that no special emphasis, exclusivity, or preference, is associated or implied by the use of this word.

Generally, in accordance with the various illustrative embodiments disclosed herein, an instrument such as an oscilloscope or a bit error rate test (BERT) instrument incorporates a signal quality evaluation system that includes a decision feedback equalizer (DFE) connected to a signal quality evaluator. In one exemplary implementation, the DFE receives a signal containing symbols that represent digital data, and uses the symbols to generate various detection thresholds. More particularly, each detection threshold generated by the DFE is one of several detection thresholds that can be generated by the DFE by processing one or more symbols that were present in the signal prior to any given instant in time when a detection threshold is generated. The DFE includes a digital filter that has a number of filter taps. The number of filter taps that are incorporated into the digital filter determines the number of detection thresholds that can be generated by the DFE. For example, a single filter tap would allow the DFE to generate two detection thresholds based on evaluating one symbol present in the signal prior to any given instant in time, whereas two filter taps would allow the DFE to generate four detection thresholds based on evaluating two symbols present in the signal prior to any given instant in time, and so on.

The signal quality evaluator uses the detection thresholds provided by the DFE to detect a transition (when and if present) in the signal. Upon detecting a transition, the signal quality evaluator may execute a time interval error (TIE) measurement and/or a jitter measurement upon one or both edges of a symbol in the signal. In one exemplary embodiment, the signal quality evaluator executes a first TIE measurement (and/or jitter measurement) upon a first edge of the symbol at a point corresponding to the detection threshold that is utilized to detect the transition and a second TIE measurement (and/or jitter measurement) upon a second edge of the symbol at the point corresponding to the detection threshold that is utilized to detect the transition.

FIG. 1 shows a system 100 that includes some exemplary functional blocks for evaluating timing characteristics of a signal in accordance with an embodiment of the present invention. In this exemplary embodiment, the system 100 represents an oscilloscope. However, in other embodiments, system 100 can be one of various other types of instruments such as a BERT system or a signal analyzer. The exemplary functional blocks of system 100 include an input interface 105 that is configured to receive an input signal and to provide this input signal to an analog-to-digital converter 115. The input signal contains a plurality of symbols having voltage levels that represent digital data. For example, in one embodiment, the input signal is a binary signal having a first voltage level that represents a logic "1" state and a second voltage level that represents a logic "0" state. In another exemplary embodiment, the input signal is a quaternary signal having a first voltage level that represents a first logic combination ("00"), a second voltage level that represents a second logic combination ("01"), a third voltage level that represents a third logic combination ("10"), and a fourth voltage level that represents a fourth logic combination ("11").

The analog-to-digital converter 115 converts the input signal into digital data that can be operated upon in the digital domain by devices such as a digital signal processor (DSP), a field-programmable gate array (FPGA), or a processor. It should therefore be understood that the various functional blocks shown in FIG. 1, and particularly the signal quality evaluation system 110, can be implemented by utilizing devices that process digital data such as a DSP, an FPGA, or a processor. A memory containing non-transitory computer-executable instructions can be coupled to one or more of such devices. For example, when a processor (or a DSP) is utilized, the processor (or the DSP) fetches and executes the non-transitory computer-executable instructions from the memory in order to implement the various functionalities described herein in accordance with the disclosure.

The digital data is typically processed synchronously inside the signal quality evaluation system 110 by utilizing a recovered clock. In this exemplary configuration, a clock recovery circuit 130 is configured for obtaining a recovered clock from the input signal. The recovered clock is utilized by the various functional blocks inside the signal quality evaluation system 110.

The digital data that is output by the analog-to-digital converter 115 is coupled into an oscilloscope signal processing system 120, which operates upon the digital data to generate a drive signal for driving an oscilloscope display 125. With particular respect to signal quality observation, the oscilloscope signal processing system 120 generates an eye-diagram on the oscilloscope display 125 whenever a user sets various front-panel controls to observe the eye-diagram of the input signal.

The digital data that is output by the analog-to-digital converter 115 is also coupled into the signal quality evaluation system 110, which processes the digital data in order to evaluate timing characteristics that are indicative of jitter and time interval errors in the input signal. The timing characteristics are evaluated in the signal quality evaluation system 110 by utilizing a decision feedback equalizer (DFE) 111 and a signal quality evaluator 112. The DFE 111 receives the digital data that is output by the analog-to-digital converter 115 via a line 107, and uses the digital data to generate multiple detection thresholds in a manner that is described below in more detail. The detection thresholds are coupled into the signal quality evaluator 112. In some implementations, the detection thresholds are also coupled into the oscilloscope signal processing system 120 via a line 109 (shown in a dotted line format). The detection thresholds are utilized by the oscilloscope signal processing system 120 to generate the eye-diagram that reflects the behavior of the DFE 111.

In addition to receiving the detection thresholds from the DFE 111 (via the line 108), the signal quality evaluator 112 also receives the digital data that is output by the analog-to-digital converter 115 (via the line 107). The detection thresholds provided by the DFE 111 are utilized to execute various types of signal quality measurements, some of which are described below in more detail.

Figure 2:
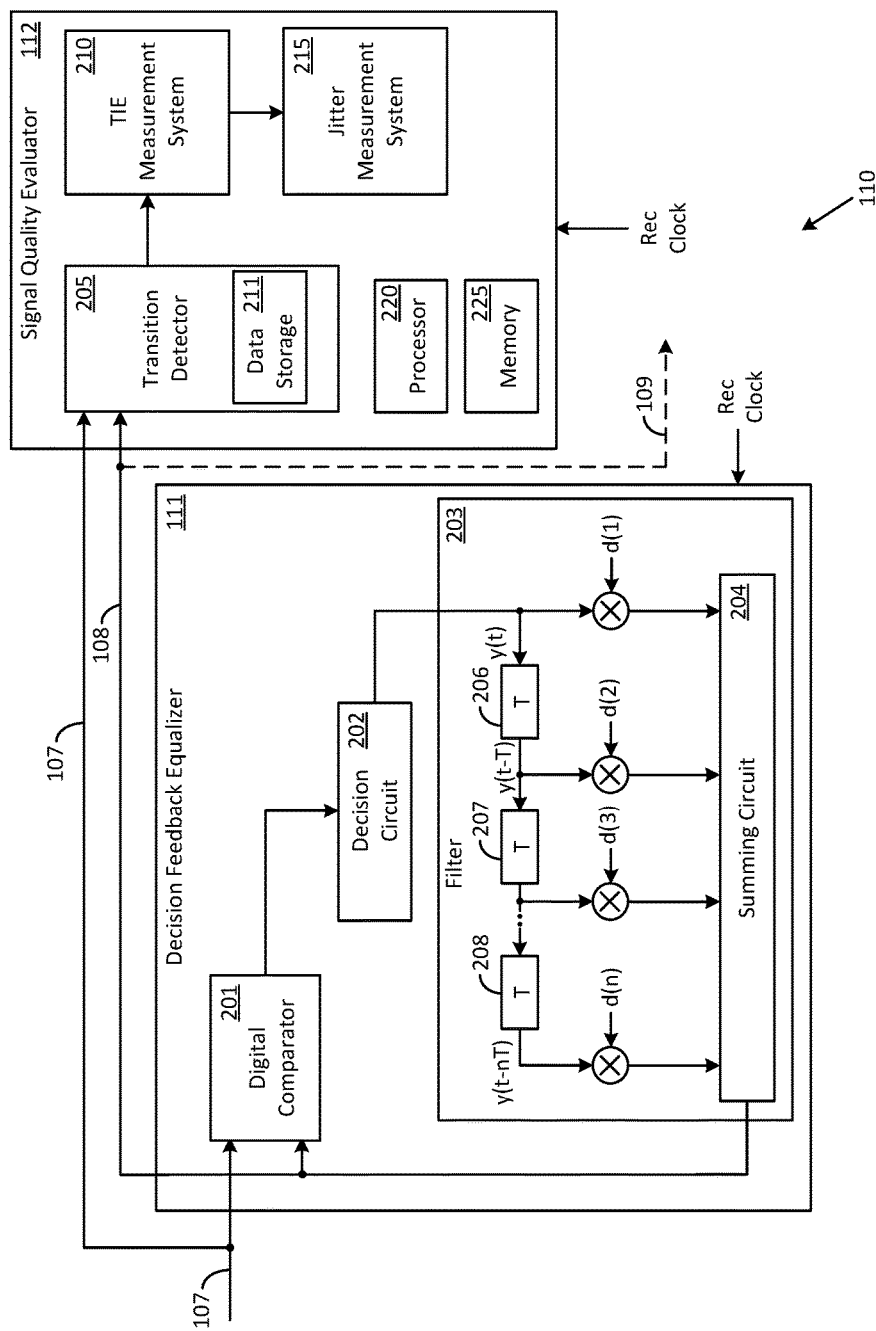
FIG. 2 shows an exemplary decision feedback equalizer (DFE) and an exemplary signal quality evaluator that can be incorporated into the system shown in FIG. 1.

FIG. 2 shows the DFE 111 and the signal quality evaluator 112 that are included in the signal quality evaluation system 110 in accordance with an exemplary implementation of the invention. As shown in FIG. 1, the signal quality evaluation system 110 receives the digital data that is output by the analog-to-digital converter 115 via the line 107, and generates detection thresholds based on one or more symbols present in the digital data. More particularly, the DFE 111 generates the detection thresholds by utilizing a digital comparator 201, a decision circuit 202, and a digital filter 203. The digital comparator 201 is configured to receive the digital data that is output by the analog-to-digital converter 115 via the line 107 and compare the digital data against the detection thresholds provided by the digital filter 203. The decision circuit 202 evaluates the output of the digital comparator 201 and provides a stream of symbols to the digital filter 203. The symbol stream is coupled into "n" filter taps (n≥1) that are incorporated into the digital filter 203. The "n" filter taps (tap 206, tap 207, through tap 208) apply filter coefficients (d(1) through d(n)) to the symbol stream.

The digital filter 203 further includes a summing circuit 204 that executes a summing operation upon "n" signals provided via the "n" filter taps. The output of the summing circuit 204 constitutes the detection thresholds that are provided to the digital comparator 201 and to the signal quality evaluator (via the line 108) as described below in more detail. Each detection threshold is one of $2^n$ possible detection thresholds that can be generated by the digital filter 203 on the basis of the "n" filter taps and "n" filter coefficients that are utilized. For example, when a single filter tap (n=1) is utilized, the digital filter 203 generates a detection threshold that can be one of two possible detection thresholds. When two filter taps are utilized, the digital filter 203 generates a detection threshold that can be one of four possible detection thresholds, and so on.

The detection thresholds provided by the DFE 111 to the signal quality evaluator 112 are utilized by a transition detector 205 to identify various transitions in symbols contained in the input signal provided to the transition detector 205 via the line 107. This procedure is described below in more detail using other figures. A TIE measurement system 210 uses the transitions and the detection thresholds to evaluate timing characteristics of the signal. This aspect also will be described below in more detail using other figures. A jitter measurement system 215 that is coupled to the TIE measurement system 210 may be utilized to measure an amount of jitter that is present in the signal at the various transitions.

In one exemplary implementation, the transition detector 205 includes a memory device (such as a buffer memory) that is utilized as a data storage 211. The digital data that is output by the analog-to-digital converter 115 and provided to the transition detector 205 via the line 107 and/or the recovered clock that is provided to the transition detector 205 by the clock recovery circuit 130, can be stored in the data storage 211. In this exemplary implementation, the signal quality evaluator 112 further includes a processor 220 that is configured to access a memory 225 for fetching computer-executable instructions stored in the memory 225. The processor 220 executes the computer-executable instructions for implementing various operations associated with the signal quality evaluator 112 such as analyzing and operating upon the digital data stored in the data storage 211 for detecting one or more transitions in the input signal provided to the transition detector 205 via the line 107. In some embodiments, the memory 225 (which can include a random-access memory (RAM) and/or a read-only memory (ROM)) may be utilized for various other purposes including storage of information generated during the execution of the computer-executable instructions. Furthermore, in some embodiments, the processor 220 can be a system processor that is utilized to execute computer-executable instructions for implementing various other operations associated with the system 100.

Figure 3:
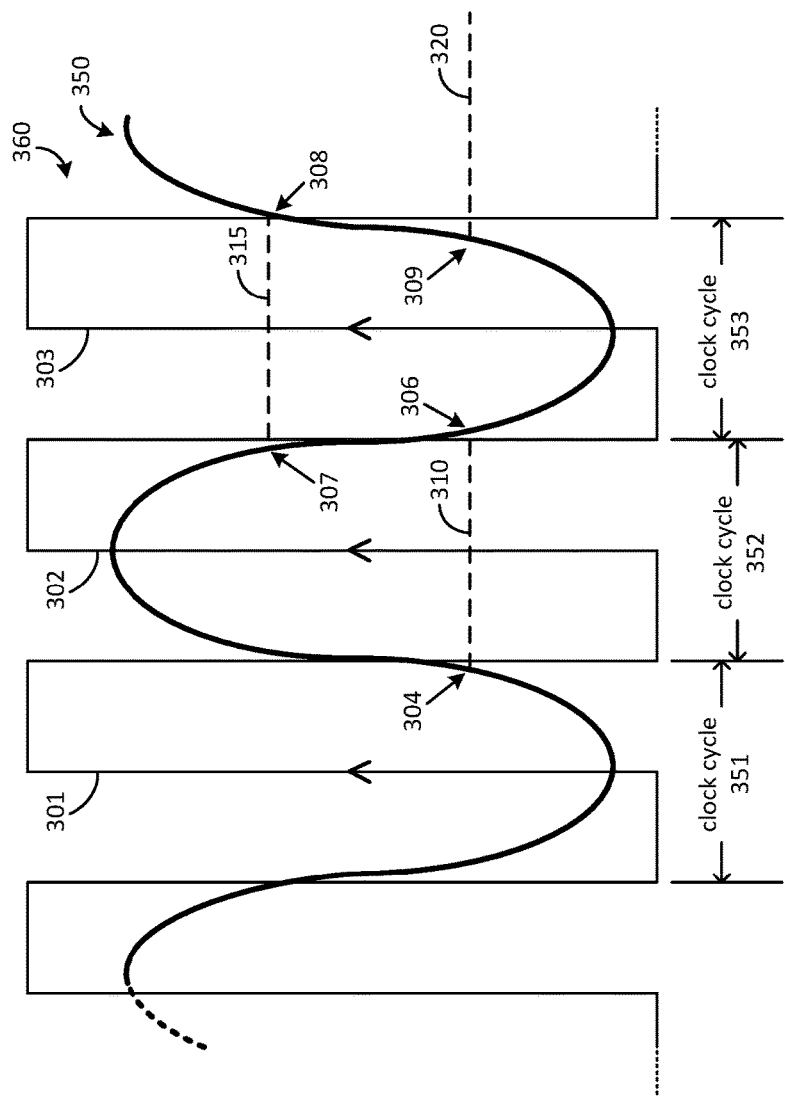
FIG. 3 shows a first exemplary waveform together with multiple detection thresholds in accordance with an embodiment of the present invention.

FIG. 3 shows a first exemplary input signal 350 together with multiple detection thresholds that are generated by the DFE 111 in accordance with an exemplary embodiment of the present invention. In this exemplary embodiment, the input signal 350 has symbols that represent either a logic "1" state or a logic "0" state. The various clock cycles shown in the figure correspond to clock cycles of a recovered clock 360 that is obtained by the clock recovery circuit 130 from the input signal 350. Each portion of the input signal 350 that occurs during a clock cycle of the recovered clock 360 represents a symbol. Thus, a first portion of the input signal 350 that occurs during a first clock cycle 351 represents a first symbol indicating a logic "0" state, a second portion of the input signal 350 that occurs during a second clock cycle 352 represents a second symbol indicating a logic "1" state, and a third portion of the input signal 350 that occurs during a third clock cycle 353 represents a third symbol indicating a logic "0" state. It should be understood that the "010" symbol sequence of the input signal 350 is utilized here merely as an example. Other symbol sequences can occur at various other times, including at times prior to the first clock cycle 351.

The digital filter 203 of the DFE 111 has a single filter tap and uses a single filter coefficient in this example embodiment. Consequently, the DFE 111 can provide to the transition detector 205, one of two possible detection thresholds. During the first clock cycle 351, the DFE 111 generates a first detection threshold 310 based on the first symbol present in the input signal 350. The first detection threshold 310 generated by the DFE 111 during the first clock cycle 351 is provided to the transition detector 205 for use to detect any voltage transition that may occur after the first clock edge 301. The transition detector 205 uses the first detection threshold 310 generated by the DFE 111 to detect a first transition 304 that occurs after the first clock edge 301 of the recovered clock 360 and prior to a second clock edge 302 of the recovered clock 360. The first clock edge 301 is a part of the first clock cycle 351 of the recovered clock and the second clock edge 302 is a part of the second clock cycle 352 of the recovered clock 360. It should be understood that in some implementations the first transition 304 may not be present when the waveform 360 has a non-return-to-zero format and a second symbol that follows the first symbol indicates a logic "0" state as well.

During the second clock cycle 352, the DFE 111 detects the second symbol indicating the logic "1" state and generates a second detection threshold 315 corresponding to the logic "1" state indicated by the second symbol. The second detection threshold 315 generated by the DFE 111 during the second clock cycle 352 is provided to the transition detector 205 for use to detect any voltage transition that may occur after the second clock edge 302. The transition detector 205 uses the second detection threshold 315 generated by the DFE 111 to detect a second transition 307 that occurs after the second clock edge 302 of the recovered clock 360 and prior to a third clock edge 303 of the recovered clock 360. It should be understood that in some implementations the second transition 307 that occurs after the second clock edge 302 of the recovered clock 360 may not be present when the waveform 360 has a non-return-to-zero format and a third symbol that follows the second symbol indicates a logic "1" state as well.

During the third clock cycle 353, the DFE 111 detects the third symbol indicating the logic "0" state and generates a third detection threshold 320 corresponding to the logic "0" state represented by the third symbol. The third detection threshold 320 generated by the DFE 111 during the third clock cycle 353 is provided to the transition detector 205 for use to detect any voltage transition that may occur after the third clock edge 303. The transition detector 205 uses the third detection threshold 320 generated by the DFE 111 to detect a third transition 309 that occurs after the third clock edge 303 of the recovered clock 360. It should be understood that in some implementations the third transition 309 that occurs after the third clock edge 303 of the recovered clock 360 may not be present when the waveform 360 has a non-return-to-zero format and a fourth symbol that follows the third symbol indicates a logic "0" state as well.

Timing characteristics of the input signal 350 may be evaluated by the TIE measurement system 210 and/or by the jitter measurement system 215 at one or more of the transitions of the input signal 350, such as at the first transition 304, the second transition 307, and the third transition 309, as well as other transitions such as a fourth transition 306 and a fifth transition 308. The fourth transition 306 may be evaluated by the TIE measurement system 210 and/or by the jitter measurement system 215 by utilizing the first detection threshold 310, and the fifth transition 308 may be evaluated by the TIE measurement system 210 and/or by the jitter measurement system 215 by utilizing the second detection threshold 315.

Using multiple detection thresholds to detect transitions in the input signal 350, followed by executing jitter and time interval error measurements at various transitions, provides better measurement granularity and more refined measurement results that more accurately represent the timing characteristics of the input signal in comparison to traditional jitter and time interval error measurements that are carried out by utilizing a single detection threshold.

It should be understood that each of the first clock edge 301, the second clock edge 302 and the third clock edge 303 is shown as a rising clock edge in this example embodiment but can be a falling clock edge in other embodiments. It should also be understood that other detection thresholds may be generated and utilized prior to the first clock cycle 351 and after the third clock cycle 353 in a manner similar to the ones described above with respect to the first clock cycle 351, the second clock cycle 352, and the third clock cycle 353.

Figure 4:
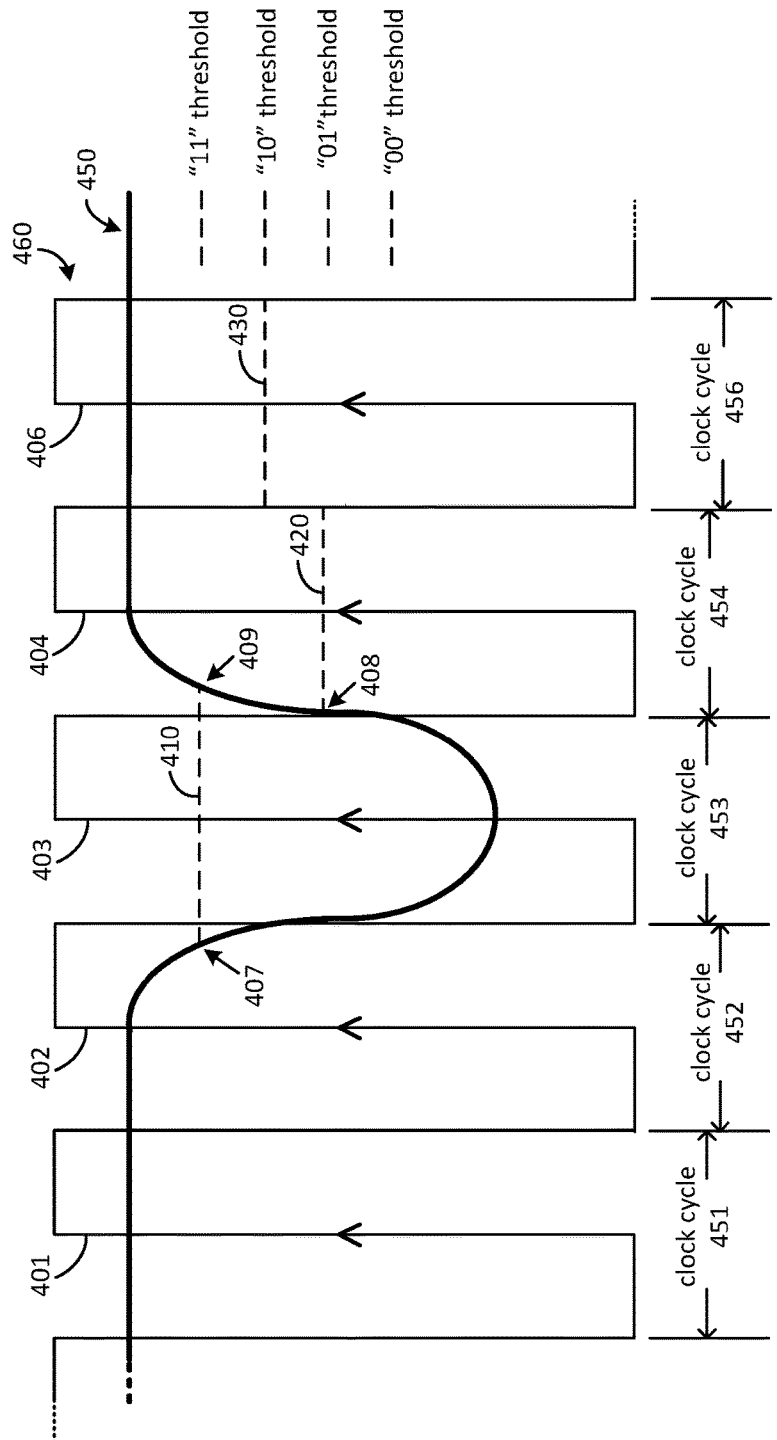
FIG. 4 shows a second exemplary waveform together with multiple detection thresholds in accordance with another embodiment of the present invention.

FIG. 4 shows a second exemplary input signal 450 together with multiple detection thresholds that are generated by the DFE 111 in accordance with another embodiment of the present invention. The various clock cycles shown in the figure correspond to clock cycles of a recovered clock 460 that is obtained by the clock recovery circuit 130 from the input signal 350. In this exemplary embodiment, the input signal 450 has symbols that indicate either a logic "1" or a logic "0." Each portion of the input signal 450 that occurs during a clock cycle of the recovered clock 460 represents a symbol. Thus, a first portion of the input signal 450 that occurs during a first clock cycle 451 represents a first symbol indicating a logic "1" state, a second portion of the input signal 450 that occurs during a second clock cycle 452 represents a second symbol indicating a logic "1" state, a third portion of the input signal 450 that occurs during a third clock cycle 453 represents a third symbol having a logic "0" state, a fourth portion of the input signal 450 that occurs during a fourth clock cycle 454 represents a fourth symbol indicating a logic "1" state, and a fifth portion of the input signal 450 that occurs during a fifth clock cycle 456 represents a fifth symbol indicating a logic "1" state.

It should be understood that the "11011" symbol sequence of the input signal 450 is used here merely as an example. Other symbol sequences can occur at various other times. The digital filter 203 of the DFE 111 has two filter taps and uses two filter coefficients in this example embodiment. Consequently, the DFE 111 can provide to the transition detector 205, one of four possible detection thresholds. Each detection threshold is generated on the basis of two symbols present in the input signal 450 prior to any particular clock cycle.

In accordance with the "11011" symbol sequence of the input signal 450, the DFE 111 generates a first detection threshold 410 based on a "11" symbol sequence that was present in the input signal 450 during the two clock cycles prior to the clock cycle 453. The first detection threshold 410 that is generated by the DFE 111 is provided to the transition detector 205 for use to detect any voltage transition that may occur after the second clock edge 402. The transition detector 205 uses the first detection threshold 410 generated by the DFE 111 to detect a first transition 407 that occurs after the second clock edge 402 and prior to a third clock edge 403 of the recovered clock 460. The second clock edge 402 is a part of the second clock cycle 452 of the recovered clock 460 and the third clock edge 403 is a part of the third clock cycle 453 of the recovered clock 460.

A second detection threshold 420 is generated based on a "01" symbol sequence that was present in the input signal 450 during the two clock cycles prior to the clock cycle 454. The second detection threshold 420 generated by the DFE 111 is provided to the transition detector 205 for use to detect any voltage transition that may occur after the third clock edge 403. The transition detector 205 uses the second detection threshold 420 generated by the DFE 111 to detect a second transition 408 that occurs after the third clock edge 403 and prior to a fourth clock edge 404 of the recovered clock 460.

A third detection threshold 430 is generated based on a "10" symbol sequence that was present in the input signal 450 during the two clock cycles prior to the clock cycle 456. The third detection threshold 430 generated by the DFE 111 is provided to the transition detector 205 for use to detect any voltage transition that may occur after the fourth clock edge 404. In this example, there is no transition in the input signal 450 after the fourth clock edge 404 and during the clock cycle 456. The absence of transitions during the clock cycle 456 is due to the logic "1" state that occurs in the non-return-to-zero input signal 450 during the clock cycle 456 after the logic "1" state during the clock cycle 454.

Timing characteristics of the input signal 450 may be evaluated by the TIE measurement system 210 and/or by the jitter measurement system 215 at one or more of the transitions of the input signal 450 such as at the first transition 407 and the second transition 408, as well as at other transitions such as a third transition 409. The third transition 409 may be evaluated by the TIE measurement system 210 and/or by the jitter measurement system 215 by utilizing the first detection threshold 410.

Using multiple detection thresholds to detect transitions in the input signal 450, followed by executing jitter and time interval error measurements at various transitions, provides better measurement granularity and more refined measurement results that more accurately represent the timing characteristics of the input signal in comparison to traditional jitter and time interval error measurements that are carried out by utilizing a single detection threshold.

It should be understood that each of the first clock edge 401, the second clock edge 402, the third clock edge 403, the fourth clock edge 404, and the fifth clock edge 406 is shown as a rising clock edge in this example embodiment but can be a falling clock edge in other embodiments. It should also be understood that other detection thresholds may be generated and utilized during other clock cycles in a manner similar to the ones described above with respect to the first clock cycle 451, the second clock cycle 452, the third clock cycle 453, and the fourth clock cycle 454. Though not utilized in this example, a detection threshold corresponding to a "00" symbol sequence is also shown in FIG. 4 for purposes of illustration.

Figure 5:
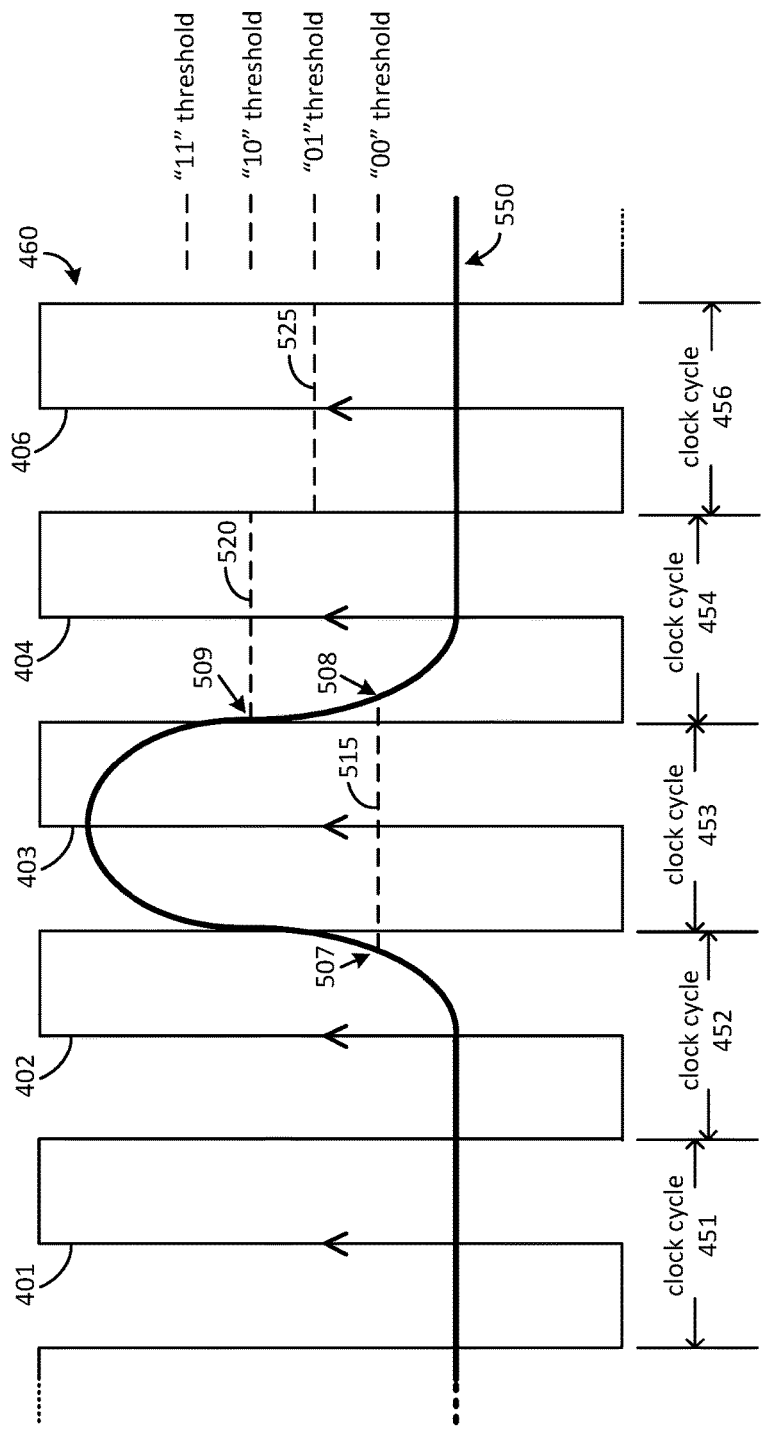
FIG. 5 shows a third exemplary waveform together with multiple detection thresholds in accordance with yet another embodiment of the present invention.

FIG. 5 shows a third exemplary input signal 550 together with multiple detection thresholds that are generated by the DFE 111 in accordance with another embodiment of the present invention. In this exemplary embodiment, the input signal 550 represents a "00100" symbol sequence that may occur during the clock cycles of the recovered clock 460 shown in FIG. 4 (i.e., in place of the "11011" sequence shown in FIG. 4). The input signal 550 has a non-return-to-zero format similar to the input signal 450 shown in FIG. 4. The various thresholds that are generated by the DFE 111 on the basis of the "00100" symbol sequence and utilized by the transition detector 205 will now be described.

A first portion of the input signal 550 that occurs during the first clock cycle 451 represents a first symbol indicating a logic "0" state, a second portion of the input signal 550 that occurs during the second clock cycle 452 represents a second symbol indicating a logic "0" state, a third portion of the input signal 550 that occurs during the third clock cycle 453 represents a third symbol having a logic "1" state, a fourth portion of the input signal 550 that occurs during the fourth clock cycle 454 represents a fourth symbol indicating a logic "0" state, and a fifth portion of the input signal 550 that occurs during the fifth clock cycle 456 represents a fifth symbol indicating a logic "0" state.

The digital filter 203 of the DFE 111 has two filter taps and uses two filter coefficients as described above with respect to FIG. 4.

In accordance with the "00100" symbol sequence of the input signal 550, the first detection threshold 515 is generated based on a "00" symbol sequence that was present in the input signal 550 during the two clock cycles prior to the clock cycle 453. The first detection threshold 515 that is generated by the DFE 111 is provided to the transition detector 205 for use to detect any voltage transition that may occur after the second clock edge 402. The transition detector 205 uses the first detection threshold 515 generated by the DFE 111 to detect a first transition 507 that occurs after the second clock edge 402 and prior to the third clock edge 403 of the recovered clock 460.

A second detection threshold 520 is generated based on a "10" symbol sequence that was present in the input signal 550 during the two clock cycles prior to the clock cycle 454. The second detection threshold 520 generated by the DFE 111 is provided to the transition detector 205 for use to detect any voltage transition that may occur after the third clock edge 403. The transition detector 205 uses the second detection threshold 520 generated by the DFE 111 to detect a second transition 509 that occurs after the third clock edge 403 and prior to the fourth clock edge 404 of the recovered clock 460.

A third detection threshold 525 is generated based on a "01" symbol sequence that was present in the input signal 550 during the two clock cycles prior to the clock cycle 456. The third detection threshold 525 generated by the DFE 111 is provided to the transition detector 205 for use to detect any voltage transition that may occur after the fourth clock edge 404. In this example, there is no transition in the input signal 550 after the fourth clock edge 404 and during the clock cycle 456. The absence of transitions during the clock cycle 456 is due to the logic "0" state that occurs in the non-return-to-zero waveform format of the input signal 550 during the clock cycle 456 after the logic "0" state during the clock cycle 454.

Timing characteristics of the input signal 550 may be evaluated by the TIE measurement system 210 and/or by the jitter measurement system 215 at one or more of the transitions of the input signal 550 such as at the first transition 507 and the second transition 509, as well as other transitions such as a third transition 508. The third transition 508 may be evaluated by the TIE measurement system 210 and/or by the jitter measurement system 215 by utilizing the first detection threshold 515.

Using multiple detection thresholds to detect transitions in the input signal 550, followed by executing jitter and time interval error measurements at various transitions, provides better measurement granularity and more refined measurement results that more accurately represent the timing characteristics of the input signal in comparison to traditional jitter and time interval error measurements that are carried out by utilizing a single detection threshold.

Figure 6:
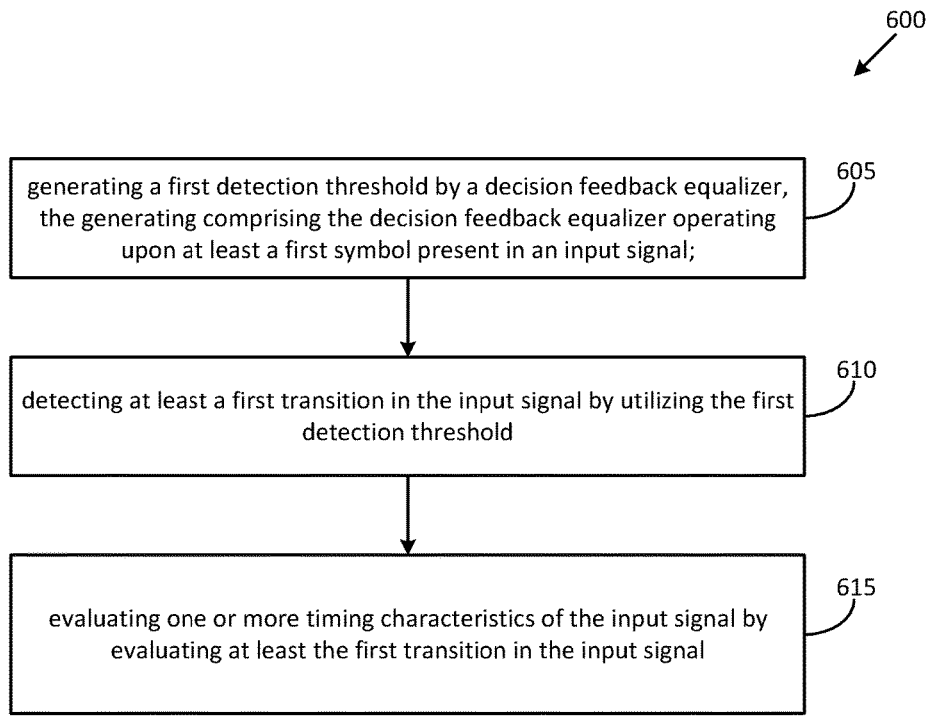
FIG. 6 shows a first exemplary flowchart of a method for evaluating one or more timing characteristics of an input signal.

FIG. 6 shows an exemplary flowchart 600 of a method for evaluating one or more timing characteristics of an input signal. Block 605 describes generating a first decision threshold by a decision feedback equalizer. This operation can include the decision feedback equalizer operating upon at least a first symbol present in an input signal, wherein the first symbol indicates a first logic state. The first detection threshold may be generated by the decision feedback equalizer by operating upon the first symbol during a first clock cycle of a recovered clock.

One example of the action described in block 605 is the DFE 111 generating a first detection threshold 310 by operating upon a first symbol present in the input signal during the first clock cycle 351 of the recovered clock 360 (as illustrated in FIG. 3). The first symbol is operated upon by elements of the DFE 111 such as the digital filter 203 incorporating a single filter tap. Another example of the action described in block 605 is the DFE 111 generating a first detection threshold 410 by operating upon a first symbol and at least one other symbol (a "11" symbol sequence) present in the input signal during two previous clock cycles (second clock cycle 452 and first clock cycle 451) of the recovered clock 460 (as illustrated in FIG. 4). The first symbol and the second symbol are operated upon by elements of the DFE 111 such as the digital filter 203 incorporating two filter taps.

Block 610 indicates detecting at least a first transition in the input signal by utilizing the first detection threshold. One example of the action described in block 610 is the transition detector 205 utilizing the first detection threshold 310 for detecting a first transition 304 that occurs after the first clock edge 301 of the recovered clock 360 and prior to a second clock edge 302 of the recovered clock 360 (shown in FIG. 3). The first clock edge 301 is a part of a first clock cycle 351 of the recovered clock 360 and the second clock edge 302 is a part of a second clock cycle 352 of the recovered clock 360. Another example of the action described in block 610 is the transition detector 205 utilizing the first detection threshold 410 generated by the DFE 111 for detecting a first transition 407 that occurs after the second clock edge 402 and prior to a third clock edge 403 of the recovered clock 460. The second clock edge 402 is a part of the second clock cycle 452 of the recovered clock 460 and the third clock edge 403 is a part of the third clock cycle 453 of the recovered clock 460.

Block 615 indicates evaluating one or more timing characteristics of the input signal by evaluating at least the first transition in the input signal. One example of the action described in block 615 is the TIE measurement system 210 and/or the jitter measurement system 215 evaluating timing characteristics of the input signal 350 at one or more of transitions of the input signal 350 such as at the first transition 304 and the second transition 307. Another example of the action described in block 615 is the TIE measurement system 210 and/or the jitter measurement system 215 evaluating timing characteristics of the input signal 450 at one or more of the transitions of the input signal 450 such as the first transition 407 and the second transition 408.

The flowchart 600 may be iteratively executed for evaluating various timing characteristics of the input signal. For example, in one implementation, block 605 and block 610 may be iteratively executed several times in real time or near-real time before execution of block 615. In another example implementation, block 605, block 610 and block 615 may be iteratively executed multiple times in order to evaluate the timing characteristics of the input signal in real time or near-real time.

During one such iterative execution, and with reference to block 605, the decision feedback equalizer is utilized for generating a second detection threshold by operating upon at least a second symbol present in the input signal, wherein the first transition in the input signal is a part of the second symbol. The second detection threshold, which is different than the first detection threshold, is generated by the decision feedback equalizer during a second clock cycle of the recovered clock (the second symbol indicates a second logic state). One example of such action associated with block 605 is the DFE 111 generating a second detection threshold 315 by operating upon the second symbol present in the input signal 350 during the second clock cycle 352 of the recovered clock 360 (as illustrated in FIG. 3). The first transition 304 in the input signal 350 is a part of the second symbol. Another example of this action associated with block 605 is the DFE 111 generating a second detection threshold 420 by operating upon a first symbol and a second symbol ("01" symbol sequence) present in the input signal during two previous clock cycles (third clock cycle 453 and second clock cycle 452 of the recovered clock 460) prior to the clock cycle 454 (as illustrated in FIG. 4).

As a part of an iterative procedure and with reference to block 610, the second detection threshold 315 is utilized by the transition detector 205 to detect at least the second transition in the input signal. One example of this action is the transition detector 205 utilizing the second detection threshold 315 to detect a second transition 307 that occurs after the second clock edge 302 of the recovered clock 360 and prior to a third clock edge 303 of the recovered clock 360 (shown in FIG. 3).

As a part of an iterative procedure and with reference to block 615, the TIE measurement system 210 and/or the jitter measurement system 215 is utilized for evaluating one or more timing characteristics of the input signal by evaluating at least the second transition 307 in the input signal.

Figure 7:
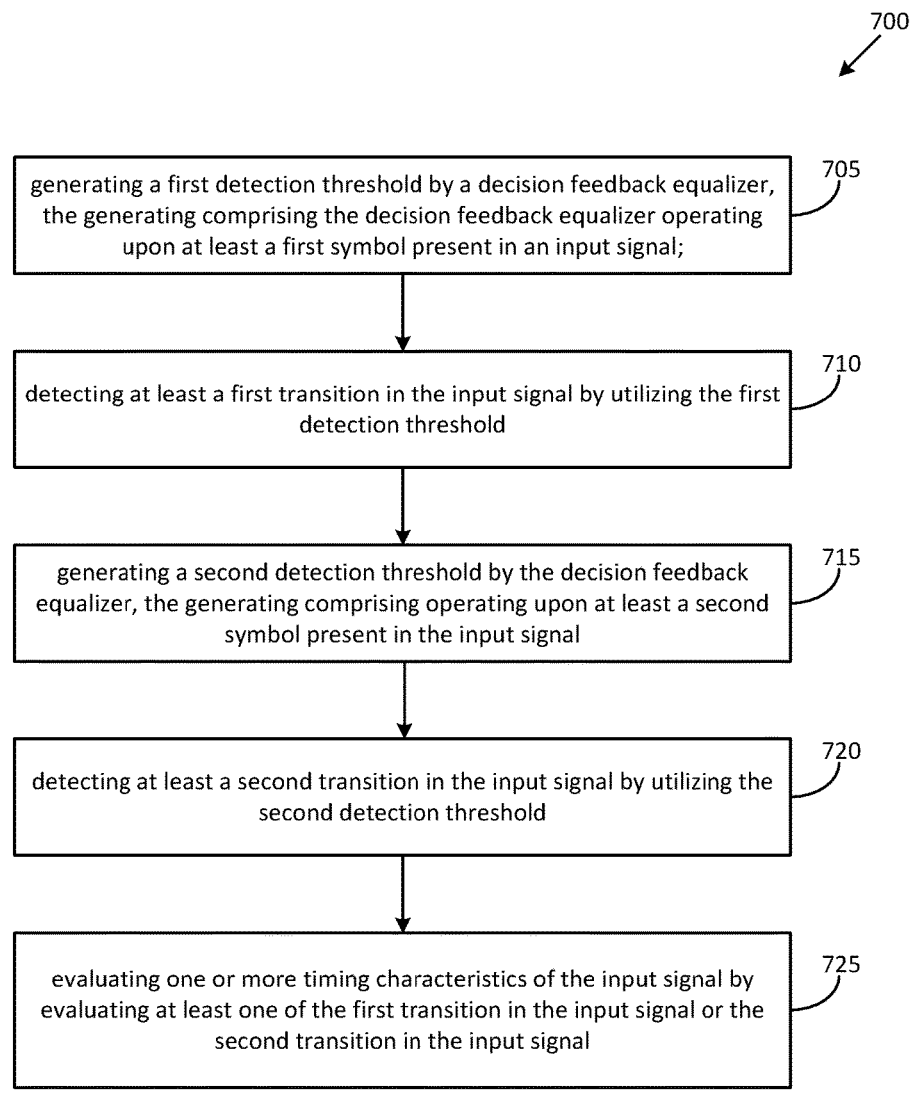
FIG. 7 shows a second exemplary flowchart of a method for evaluating one or more timing characteristics of an input signal.

FIG. 7 shows an exemplary flowchart 700 of a method for evaluating one or more timing characteristics of an input signal. Block 705 and block 710 are similar to block 605 and block 610 described above. Block 715 indicates generating a second detection threshold by the decision feedback equalizer. This operation can include the decision feedback equalizer operating upon at least a second symbol present in the input signal. The second detection threshold, which is different than the first detection threshold, is generated by the decision feedback equalizer during a second clock cycle of the recovered clock.

Block 720 indicates detecting at least a second transition in the input signal by utilizing the second detection threshold. One example of this action is the transition detector 205 utilizing the second detection threshold 315 to detect a second transition 307 that occurs after the second clock edge 302 of the recovered clock 360 and prior to a third clock edge 303 of the recovered clock 360 (shown in FIG. 3).

Block 725 indicates evaluating one or more timing characteristics of the input signal by evaluating at least one of the first transition in the input signal or the second transition in the input signal. One example of this action is the TIE measurement system 210 and/or the jitter measurement system 215 being utilized for evaluating one or more timing characteristics of the input signal at one or more of transitions of the input signal 350 such as at the first transition 304 and the second transition 307 in the input signal (shown in FIG. 3).

The method illustrated by the flowchart 700 can further include actions such as obtaining a recovered clock from the input signal; generating the first detection threshold during a first clock cycle of the recovered clock (for example, DFE 111 utilized to generate first detection threshold 310 during a first clock cycle 351); generating the second detection threshold during the second clock cycle of the recovered clock (for example, generating the second detection threshold 315 during the second clock cycle 352 of the recovered clock 360).

The first symbol, which indicates a first logic state, is present in the input signal 350 prior to the first clock cycle 351, and the second symbol, which indicates a second logic state, is present in the input signal 350 prior to the second clock cycle 352. The second detection threshold, which is different than the first detection threshold, is generated by the DFE 111 during the second clock cycle 352 of the recovered clock. The first transition 304 is a part of the second symbol present in the input signal 350.

Evaluating one or more timing characteristics of the input signal 350, which may be carried out by evaluating at least one of the first transition 304 in the input signal 350 or the second transition 307 in the input signal 350, includes determining a timing relationship of at least one of the first transition 304 or the second transition 307 with respect to one or more clock edges of the recovered clock 360. Some examples of the timing characteristics include a jitter characteristic and a time interval error.

An exemplary system 100 that can be utilized to execute various actions in accordance with the invention includes a decision feedback equalizer 111 configured to generate a first detection threshold by operating upon at least a first symbol present in an input signal. The exemplary system 100 also includes a signal quality evaluator 112 configured to receive the first detection threshold from the decision feedback equalizer 111; detect at least a first transition in the input signal by utilizing the first detection threshold; and evaluate one or more timing characteristics of the input signal by evaluating at least the first transition in the input signal. The exemplary system further includes a clock recovery circuit 130 configured to obtain a recovered clock from the input signal. Some examples of the timing characteristics include a jitter characteristic and a time interval error.

In one or more exemplary implementations, the decision feedback equalizer 111 is further configured to generate a second detection threshold by operating upon at least a second symbol present in a signal. The signal quality evaluator 112 is further configured to receive the second detection threshold from the decision feedback equalizer 111; detect at least a second transition in the input signal by utilizing the second detection threshold; and evaluate one or more timing characteristics of the input signal by evaluating at least one of the first transition in the input signal or the second transition in the input signal.

In one or more exemplary implementations, the decision feedback equalizer 111 is further configured to generate the first detection threshold during a first clock cycle of the recovered clock and to generate the second detection threshold during the second clock cycle of the recovered clock.

In summary, it should be noted that the invention has been described with reference to a few illustrative embodiments for the purpose of demonstrating the principles and concepts of the invention. It will be understood by persons of skill in the art, in view of the description provided herein, that the invention is not limited to these illustrative embodiments. Persons of skill in the art will understand that many such variations can be made to the illustrative embodiments without deviating from the scope of the invention.

What is claimed is:

1. A method comprising:
   generating a first detection threshold by a decision feedback equalizer, the generating comprising the decision feedback equalizer operating upon at least a first symbol present in an input signal;
   detecting at least a first transition in the input signal by utilizing the first detection threshold; and
   evaluating one or more timing characteristics of the input signal by evaluating at least the first transition in the input signal.

2. The method of claim 1, further comprising:
   obtaining a recovered clock from the input signal.

3. The method of claim 2, wherein operating upon the at least the first symbol present in the input signal comprises operating upon the first symbol during a first clock cycle of the recovered clock.

4. The method of claim 2, wherein operating upon the at least the first symbol present in the input signal comprises operating upon the first symbol and at least one other symbol during a first clock cycle of the recovered clock.

5. The method of claim 2, wherein the first transition in the input signal is a part of a second symbol present in the input signal, and further comprising:
   generating a second detection threshold by the decision feedback equalizer, the generating comprising decision feedback equalizer operating upon at least the second symbol present in the input signal;
   detecting at least a second transition in the input signal by utilizing the second detection threshold; and
   evaluating one or more timing characteristics of the input signal by evaluating at least the second transition in the input signal.

6. The method of claim 5, wherein the first detection threshold is generated by the decision feedback equalizer during a first clock cycle of the recovered clock and the second detection threshold is generated by the decision feedback equalizer during a second clock cycle of the recovered clock.

7. The method of claim 5, wherein the first symbol indicates a first logic state, the second symbol indicates a second logic state, and the first detection threshold is different than the second detection threshold.

8. A method comprising:
   generating a first detection threshold by a decision feedback equalizer, the generating comprising the decision feedback equalizer operating upon at least a first symbol present in an input signal;
   detecting at least a first transition in the input signal by utilizing the first detection threshold;
   generating a second detection threshold by the decision feedback equalizer, the generating comprising decision feedback equalizer operating upon at least a second symbol present in the input signal;
   detecting at least a second transition in the input signal by utilizing the second detection threshold; and
   evaluating one or more timing characteristics of the input signal by evaluating at least one of the first transition in the input signal or the second transition in the input signal.

9. The method of claim 8, further comprising:
   obtaining a recovered clock from the input signal;
   generating the first detection threshold during a first clock cycle of the recovered clock; and
   generating the second detection threshold during a second clock cycle of the recovered clock.

10. The method of claim 9, wherein the first symbol is present in the input signal prior to the first clock cycle and the second symbol is present in the input signal prior to the second clock cycle.

11. The method of claim 10, wherein the first transition is a part of the second symbol present in the input signal.

12. The method of claim 10, wherein evaluating the at least one of the first transition in the input signal or the second transition in the input signal comprises determining a timing relationship of the at least one of the first transition or the second transition with respect to one or more clock edges of the recovered clock.

13. The method of claim 12, wherein the one or more timing characteristics comprises at least one of a jitter characteristic or a time interval error.

14. The method of claim 9, wherein the first symbol indicates a first logic state, the second symbol indicates a second logic state, and the first detection threshold is different than the second detection threshold.

15. A system comprising:
    a decision feedback equalizer configured to generate a first detection threshold by operating upon at least a first symbol present in an input signal; and
    a signal quality evaluator configured to:
      receive the first detection threshold from the decision feedback equalizer;
      detect at least a first transition in the input signal by utilizing the first detection threshold; and
      evaluate one or more timing characteristics of the input signal by evaluating the at least the first transition in the input signal.

16. The system of claim 15, wherein the decision feedback equalizer is further configured to generate a second detection threshold by operating upon at least a second symbol present in the input signal, and wherein the signal quality evaluator is further configured to:
    receive the second detection threshold from the decision feedback equalizer;
    detect at least a second transition in the input signal by utilizing the second detection threshold; and
    evaluate one or more timing characteristics of the input signal by evaluating at least one of the first transition in the input signal or the second transition in the input signal.

17. The system of claim 16, further comprising:
a clock recovery circuit configured to obtain a recovered clock from the input signal.

18. The system of claim 17, wherein the decision feedback equalizer is further configured to generate the first detection threshold during a first clock cycle of the recovered clock.

19. The system of claim 18, wherein the decision feedback equalizer is further configured to generate the second detection threshold during a second clock cycle of the recovered clock.

20. The system of claim 16, wherein the one or more timing characteristics of the input signal comprises at least one of a jitter characteristic or a time interval error.

* * * * *